(12) United States Patent
Zhang et al.

(10) Patent No.: US 10,381,454 B2
(45) Date of Patent: Aug. 13, 2019

(54) INTERFACE ENGINEERING FOR HIGH CAPACITANCE CAPACITOR FOR LIQUID CRYSTAL DISPLAY

(71) Applicant: Applied Materials, Inc., Santa Clara, CA (US)

(72) Inventors: Xuena Zhang, San Jose, CA (US); Dong-Kil Yim, Pleasanton, CA (US); Wenqing Dai, San Jose, CA (US); Harvey You, Mountain View, CA (US); Tae Kyung Won, San Jose, CA (US); Hsiao-Lin Yang, Taipei (TW); Wan-Yu Lin, Taipei (TW); Yun-chu Tsai, Taichung (TW)

(73) Assignee: PATTERSON + SHERIDAN LLP, Santa Clara, CA (US)

( * ) Notice: Subject to any disclaimer, the term of this patent is extended or adjusted under 35 U.S.C. 154(b) by 37 days.

(21) Appl. No.: 15/411,724

(22) Filed: Jan. 20, 2017

(65) Prior Publication Data
US 2017/0229490 A1 Aug. 10, 2017

Related U.S. Application Data

(60) Provisional application No. 62/292,017, filed on Feb. 5, 2016.

(51) Int. Cl.
*H01L 21/02* (2006.01)
*H01L 27/12* (2006.01)
*H01L 27/32* (2006.01)
*H01L 29/49* (2006.01)
*H01L 49/02* (2006.01)
(Continued)

(52) U.S. Cl.
CPC ...... *H01L 29/4908* (2013.01); *H01L 21/0228* (2013.01); *H01L 21/02274* (2013.01);
(Continued)

(58) Field of Classification Search
CPC .......... H01L 29/4908; H01L 21/02274; H01L 21/0228; H01L 27/1222; H01L 27/1248
See application file for complete search history.

(56) References Cited

U.S. PATENT DOCUMENTS 6,137,558 A 10/2000 Koma et al.
6,621,103 B2 9/2003 Yamada
(Continued)

FOREIGN PATENT DOCUMENTS

CN 101452162 A 6/2009
JP 2012123351 A 6/2012

OTHER PUBLICATIONS

International Search Report and Written Opinion for PCT/US2017/013953 dated Apr. 27, 2017.

*Primary Examiner* — Changhyun Yi
(74) *Attorney, Agent, or Firm* — Patterson + Sheridan LLP

(57) ABSTRACT

Embodiments of the disclosure generally provide methods of forming a capacitor with high capacitance and low leakage as well as a good interface control for thin film transistor (TFT) applications. In one embodiment, a thin film transistor structure includes a capacitor formed in a thin film transistor device. The capacitor further includes a common electrode disposed on a substrate, a dielectric layer formed on the common electrode and a pixel electrode formed on the dielectric layer. An interface protection layer formed between the common electrode and the dielectric layer, or between the dielectric layer and the pixel electrode. A gate insulating layer fabricated by a high-k material may also be utilized in the thin film transistor structure.

19 Claims, 7 Drawing Sheets

(51) Int. Cl.
  *G02F 1/1362*   (2006.01)
  *G02F 1/1368*   (2006.01)

(52) U.S. Cl.
  CPC ........ *H01L 27/124* (2013.01); *H01L 27/1222* (2013.01); *H01L 27/1248* (2013.01); *H01L 27/1255* (2013.01); *H01L 27/1259* (2013.01); *H01L 28/40* (2013.01); *H01L 28/60* (2013.01); *G02F 1/1368* (2013.01); *G02F 1/136213* (2013.01); *H01L 21/02148* (2013.01); *H01L 21/02159* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02192* (2013.01); *H01L 21/02194* (2013.01); *H01L 27/3258* (2013.01); *H01L 27/3262* (2013.01); *H01L 27/3265* (2013.01); *H01L 2227/323* (2013.01)

(56) References Cited

U.S. PATENT DOCUMENTS

| | | | |
|---|---|---|---|
| 7,408,192 B2 | 8/2008 | Kang | |
| 7,742,041 B2 | 6/2010 | Lee et al. | |
| 7,850,500 B2 | 12/2010 | Park et al. | |
| 8,115,262 B2 | 2/2012 | Kim et al. | |
| 8,115,883 B2 | 2/2012 | Yamazaki et al. | |
| 8,637,868 B2 | 1/2014 | Choi et al. | |
| 8,729,556 B2 | 5/2014 | Kuriyagawa et al. | |
| 8,766,267 B2 | 7/2014 | Liu et al. | |
| 8,772,777 B2 | 7/2014 | Lee et al. | |
| 2008/0204619 A1 | 8/2008 | Saitou et al. | |
| 2009/0115924 A1* | 5/2009 | Yang | G02F 1/133555 349/39 |
| 2010/0026923 A1 | 2/2010 | Chen et al. | |
| 2011/0194062 A1 | 8/2011 | Lee | |
| 2011/0297945 A1 | 12/2011 | Jung et al. | |
| 2012/0080681 A1 | 4/2012 | Kim et al. | |
| 2012/0280236 A1 | 11/2012 | Kim | |
| 2013/0320314 A1 | 12/2013 | Kim et al. | |
| 2014/0183523 A1* | 7/2014 | Endo | H01L 27/1255 257/43 |
| 2014/0191320 A1* | 7/2014 | Hekmatshoartabari | H01L 29/66742 257/347 |
| 2015/0055073 A1 | 2/2015 | Kim et al. | |
| 2015/0212380 A1 | 7/2015 | Chen et al. | |
| 2016/0282989 A1* | 9/2016 | Hirakata | G06F 3/044 |
| 2017/0017327 A1* | 1/2017 | Chang | G06F 3/0412 |

* cited by examiner

US 10,381,454 B2

INTERFACE ENGINEERING FOR HIGH CAPACITANCE CAPACITOR FOR LIQUID CRYSTAL DISPLAY

CROSS-REFERENCE TO RELATED APPLICATIONS

This application claims benefit of U.S. Provisional Application Ser. No. 62/292,017 filed Feb. 5, 2016, which is incorporated by reference in its entirety.

BACKGROUND

Field

Embodiments of the present disclosure generally relate to forming a pixel capacitor structure with high capacitance and low leakage. More particularly, embodiments of the disclosure relate to methods for forming a pixel capacitor structure with high capacitance and low leakage for liquid crystal display (LCD) applications.

Description of the Related Art

Display devices have been widely used for a wide range of electronic applications, such as TV, monitors, mobile phone, MP3 players, e-book readers, and personal digital assistants (PDAs) and the like. The display device is generally designed for producing desired image by applying an electric field to a liquid crystal that fills a gap between two substrates (e.g., a pixel electrode and a common electrode) and has anisotropic dielectric constant that controls the intensity of the dielectric field. By adjusting the amount of light transmitted through the substrates, the light and image intensity, quality and power consumption may be efficiently controlled.

A variety of different display devices, such as active matrix liquid crystal display (AMLCD) or an active matrix organic light emitting diodes (AMOLED), may be employed as light sources for display devices which utilize touch screen panels. In the manufacturing of TFT devices, an electronic device with high electron mobility, low leakage current and high breakdown voltage, would allow more pixel area for light transmission and integration of circuitry, thereby resulting in a brighter display, higher overall electrical efficiency, faster response time and higher resolution displays. In some devices, a dielectric layer is placed between a pixel electrode and a common electrode to form a capacitor that may store electric charges when the TFT devices are in operation. The capacitor as formed is required to have high capacitance as well as low leakage to provide desired electrical performance of the TFT devices. As the capacitance may be adjusted by changing of the dielectric constant of the dielectric layer formed between the pixel electrode and the common electrode and/or thickness of the dielectric layer. For example, when the dielectric layer is replaced with a material having a higher dielectric constant, the capacitance of the capacitor will increase as well. However, selection of the material of the dielectric layer not only affects the capacitance of the capacitor, incompatibility of the material of the dielectric layer to the electrodes (either to the pixel electrode or to the common electrode) may also result in film structure peeling, poor interface adhesion, or interface material diffusion, which may eventually lead to device failure and low product yield.

Therefore, there is a need for improved methods for forming a capacitor with high capacitance and low leakage as well as a good interface control for manufacturing TFT devices that produce improved device electrical performance.

SUMMARY

Embodiments of the disclosure generally provide methods of forming a capacitor with high capacitance and low leakage as well as a good interface control for thin film transistor (TFT) applications. In one embodiment, a thin film transistor structure includes a capacitor formed in a thin film transistor device. The capacitor further includes a common electrode disposed on a substrate, a dielectric layer formed on the common electrode and a pixel electrode formed on the dielectric layer. An interface protection layer formed between the common electrode and the dielectric layer, or between the dielectric layer and the pixel electrode.

In another embodiment, a method for forming a capacitor structure on a substrate for thin film transistor applications includes forming a common electrode on a substrate utilized to form thin film transistor devices, forming a dielectric layer on the common electrode and forming a pixel electrode on the dielectric layer. An interface protection layer is formed between the common electrode and the dielectric layer, or between the dielectric layer and the pixel electrode.

In yet another embodiment, a method for forming an insulating layer on a substrate for thin film transistor applications includes forming a high-k layer on a substrate by an atomic layer deposition process or a hybrid process including atomic layer deposition and chemical vapor deposition process, wherein the high-k layer is an gate insulating layer, a passivation layer, a capacitor, an interlayer insulator, an etch stop layer in a thin film transistor device.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the disclosure generally provide methods of forming a capacitor with enhanced electrical performance, such as high capacitance and low leakage, or an insulating layer with high dielectric constant for display devices. In one example, the capacitor formed in the display devices may include a dielectric layer formed between a pixel electrode and a common electrode. The dielectric layer may be a high-k dielectric material having a dielectric constant greater than 8. In another arrangement, an interface protection layer may be formed between the pixel electrode and the dielectric layer and/or between the common electrode and the dielectric layer. Such capacitor structure may efficiently enhance the electrical performance of transistor and diode devices with good interface adhesion control. In another example, any insulating layer with high dielectric constant, such as an gate insulating layer, etching stop layer or an interface protection layer, may also utilize a high dielectric constant material for electric performance enhancement and improvement.

Figure 1:
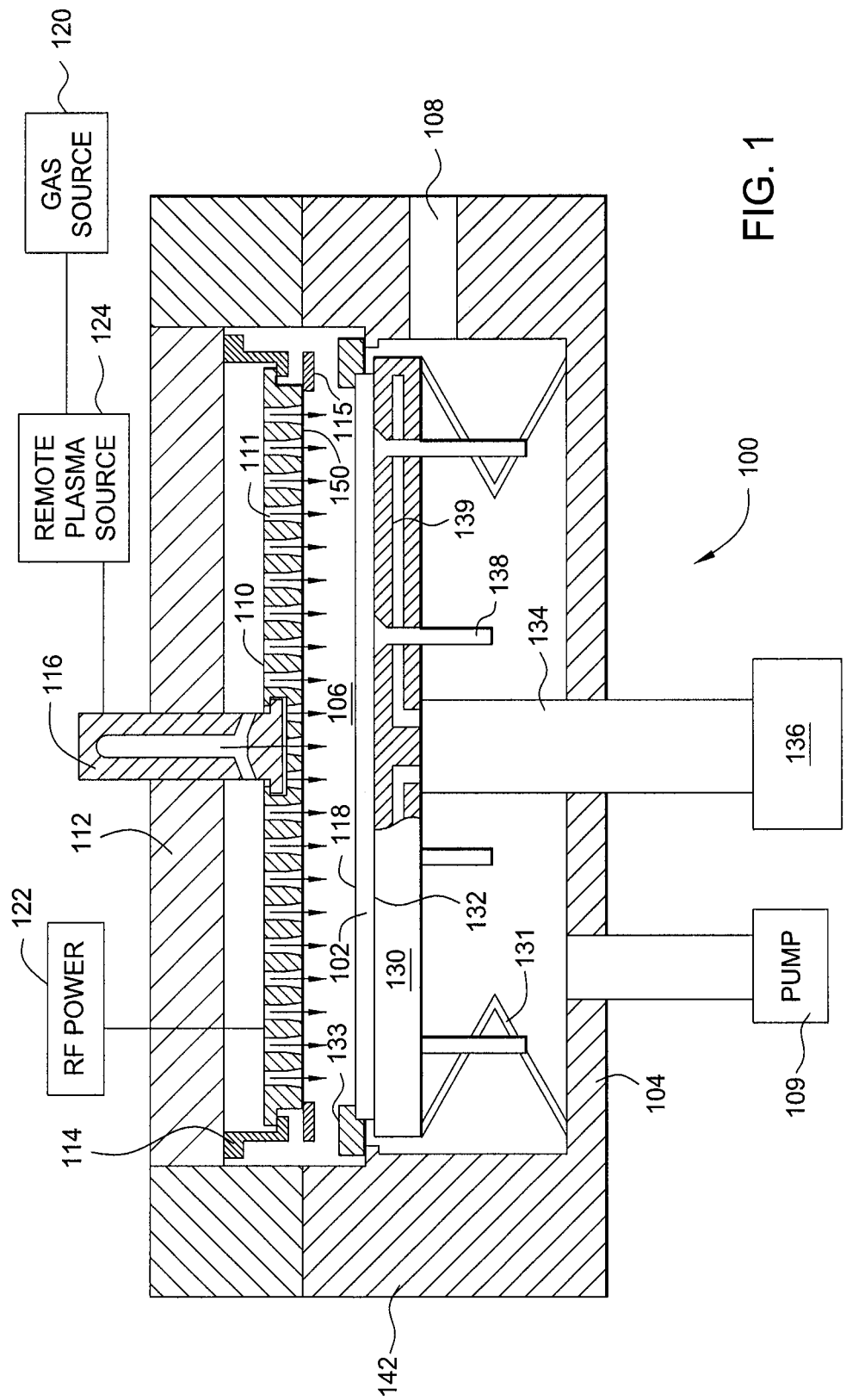
FIG. 1 depicts a sectional view of a processing chamber that may be used to deposit a dielectric layer in accordance with one embodiment of the present disclosure.

FIG. 1 is a schematic cross-section view of one embodiment of a plasma enhanced chemical vapor deposition (PECVD) chamber (processing chamber) 100 in which a dielectric layer, such as an insulating layer, a gate insulating layer, an etch stop layer, a passivation layer, an interlayer insulator, a dielectric layer for capacitor or passivation layer in a TFT device structure, may be deposited. One suitable plasma enhanced chemical vapor deposition chamber is available from Applied Materials, Inc., located in Santa Clara, Calif. It is contemplated that other deposition chambers, including those from other manufacturers, may be utilized to practice the present disclosure.

The chamber 100 generally includes walls 142, a bottom 104 and a lid 112 which bound a process volume 106. A gas distribution plate 110 and substrate support assembly 130 are disposed with in a process volume 106. The process volume 106 is accessed through a valve 108 formed through the wall 142 such that a substrate 102 may be transferred in to and out of the chamber 100.

The substrate support assembly 130 includes a substrate receiving surface 132 for supporting the substrate 102 thereon. A stem 134 couples the substrate support assembly 130 to a lift system 136 which raises and lowers the substrate support assembly 130 between substrate transfer and processing positions. A shadow frame 133 may be optionally placed over periphery of the substrate 102 when processing to prevent deposition on the edge of the substrate 102. Lift pins 138 are moveably disposed through the substrate support assembly 130 and are adapted to space the substrate 102 from the substrate receiving surface 132. The substrate support assembly 130 may also include heating and/or cooling elements 139 utilized to maintain the substrate support assembly 130 at a desired temperature. The substrate support assembly 130 may also include grounding straps 131 to provide an RF return path around the periphery of the substrate support assembly 130.

The gas distribution plate 110 is coupled at its periphery to a lid 112 or wall 142 of the chamber 100 by a suspension 114. The gas distribution plate 110 may also be coupled to the lid 112 by one or more center supports 116 to help prevent sag and/or control the straightness/curvature of the gas distribution plate 110. The gas distribution plate 110 may have different configurations with different dimensions. In an exemplary embodiment, the gas distribution plate 110 has a quadrilateral plan shape. The gas distribution plate 110 has a downstream surface 150 having a plurality of apertures 111 formed therein facing an upper surface 118 of the substrate 102 disposed on the substrate support assembly 130. The apertures 111 may have different shapes, number, densities, dimensions, and distributions across the gas distribution plate 110. In one embodiment, a diameter of the apertures 111 may be selected between about 0.01 inch and about 1 inch.

A gas source 120 is coupled to the lid 112 to provide gas through the lid 112 and then through the apertures 111 formed in the gas distribution plate 110 to the process volume 106. A vacuum pump 109 is coupled to the chamber 100 to maintain the gas in the process volume 106 at a desired pressure.

An RF power source 122 is coupled to the lid 112 and/or to the gas distribution plate 110 to provide a RF power that creates an electric field between the gas distribution plate 110 and the substrate support assembly 130 so that a plasma may be generated from the gases present between the gas distribution plate 110 and the substrate support assembly 130. The RF power may be applied at various RF frequencies. For example, RF power may be applied at a frequency between about 0.3 MHz and about 200 MHz. In one embodiment the RF power is provided at a frequency of 13.56 MHz.

In one embodiment, the edges of the downstream surface 150 of the gas distribution plate 110 may be curved so that a spacing gradient is defined between the edge and corners of the gas distribution plate 110 and substrate receiving surface 132 and, consequently, between the gas distribution plate 110 and the upper surface 118 of the substrate 102. The shape of the downstream surface 150 may be selected to meet specific process requirements. For example, the shape of the downstream surface 150 may be convex, planar, concave or other suitable shape. Therefore, the edge to corner spacing gradient may be utilized to tune the film property uniformity across the edge of the substrate, thereby correcting property non-uniformity in films disposed in the corner of the substrate. Additionally, the edge to center spacing may also be controlled so that the film property distribution uniformity may be controlled between the edge and center of the substrate. In one embodiment, a concave curved edge of the gas distribution plate 110 may be used so the center portion of the edge of the gas distribution plate 110 is spaced farther from the upper surface 118 of the substrate 102 than the corners of the gas distribution plate 110. In another embodiment, a convex curved edge of the gas distribution plate 110 may be used so that the corners of the gas distribution plate 110 are spaced farther than the edges of the gas distribution plate 110 from the upper surface 118 of the substrate 102.

A remote plasma source 124, such as an inductively coupled remote plasma source, may also be coupled between the gas source and the gas distribution plate 110. Between processing substrates, a cleaning gas may be energized in the remote plasma source 124 to remotely provide plasma utilized to clean chamber components. The cleaning gas entering the process volume 106 may be further excited by the RF power provided to the gas distribution plate 110 by the power source 122. Suitable cleaning gases include, but are not limited to, $NF_3$, $F_2$, and $SF_6$.

In one embodiment, the substrate 102 that may be processed in the chamber 100 may have a surface area of 10,000 $cm^2$ or more, such as 25,000 $cm^2$ or more, for example about 55,000 cm² or more. It is understood that after processing the substrate may be cut to form smaller other devices.

In one embodiment, the heating and/or cooling elements 139 may be set to provide a substrate support assembly temperature during deposition of about 600 degrees Celsius or less, for example between about 100 degrees Celsius and about 500 degrees Celsius, or between about 200 degrees Celsius and about 500 degrees Celsius, such as about 300 degrees Celsius and 500 degrees Celsius.

The nominal spacing during deposition between the upper surface 118 of the substrate 102 disposed on the substrate receiving surface 132 and the gas distribution plate 110 may generally vary between 400 mil and about 1,200 mil, such as between 400 mil and about 800 mil, or other distance required to obtain desired deposition results. In one exemplary embodiment wherein the gas distribution plate 110 has a concave downstream surface, the spacing between the center portion of the edge of the gas distribution plate 110 and the substrate receiving surface 132 is between about 400 mils and about 1400 mils, and the spacing between the corners of the gas distribution plate 110 and the substrate receiving surface 132 is between about 300 mils and about 1200 mils.

Figure 2:
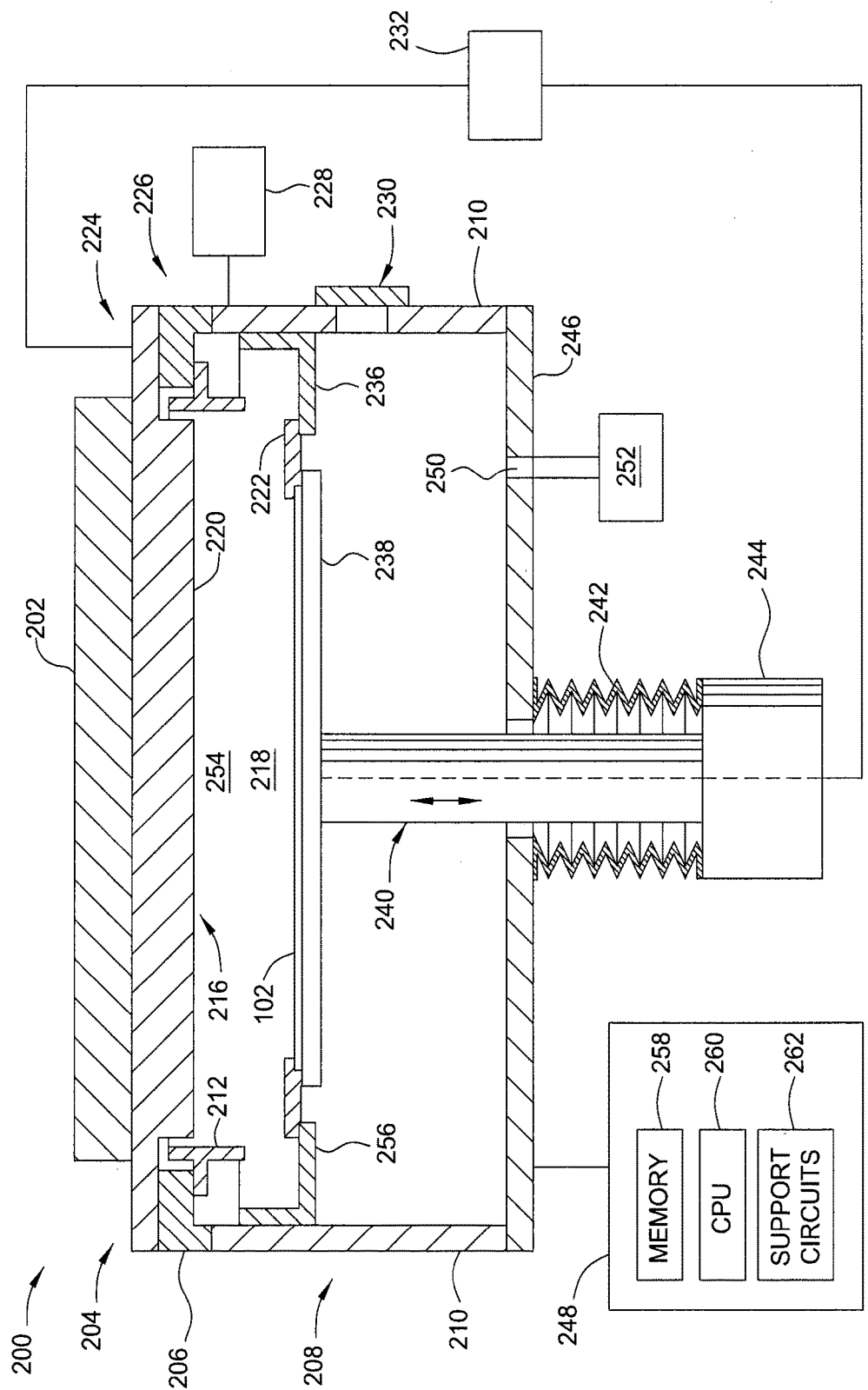
FIG. 2 depicts a sectional view of a processing chamber that may be used to deposit a metal layer in accordance with one embodiment of the present disclosure.

FIG. 2 illustrates an exemplary reactive sputter processing chamber 200 suitable for forming an interface protection layer and/or metal electrode, such as a pixel electrode or a common electrode, according to one embodiment of the invention. The processing chamber 200 may be part of a vacuum processing system having multiple processing chambers 200. One example of the process chamber that may be adapted to benefit from the invention is a physical vapor deposition (PVD) process chamber, available from Applied Materials, Inc., located in Santa Clara, Calif. It is contemplated that other sputter process chambers, including those from other manufactures, may be adapted to practice the present invention.

The processing chamber 200 includes a chamber body 208 having a processing volume 218 defined therein and enclosed by a lid assembly 204. The chamber body 208 has sidewalls 210 and a bottom 246. The dimensions of the chamber body 208 and related components of the process chamber 200 are not limited and generally are proportionally larger than the size of a substrate, such as the substrate 102 of FIG. 1, to be processed therein. As such, any suitable substrate size may be processed in a suitable sized process chamber. Examples of suitable substrate sizes include substrates having a plan surface area of about 2000 or more square centimeters.

The chamber body 208 may be fabricated from aluminum or other suitable material. A substrate access port 230 is formed through the sidewall 210 of the chamber body 208, facilitating the transfer of the substrate 102 (i.e., a solar panel or a flat panel display substrate, a plastic or flexible substrate, a semiconductor wafer, or other workpiece) into and out of the process chamber 200. The access port 230 may be coupled to a transfer chamber and/or other chambers of a substrate processing system.

A gas source 228 is coupled to the chamber body 208 to supply process gases into the processing volume 218. Examples of process gases that may be provided by the gas source 228 include inert gases, non-reactive gases, and reactive gases. In one embodiment, process gases provided by the gas source 228 may include, but not limited to, argon gas (Ar), helium (He), nitrogen gas ($N_2$), oxygen gas ($O_2$), and $H_2O$, among others.

A pumping port 250 is formed through the bottom 246 of the chamber body 208. A pumping device 252 is coupled to the process volume 218 to evacuate and control the pressure therein. In one embodiment, the pressure level of the process chamber 200 may be maintained at about 1 Torr or less.

The lid assembly 204 generally includes a target 220 and a ground shield assembly 226 coupled or positioned proximate thereto. The target 220 provides a material source that can be sputtered and deposited onto the surface of the substrate 102 during a PVD process. The target 220 or target plate may be fabricated from a material utilized as a deposition specie. A high voltage power supply, such as a power source 232, is connected to the target 220 to facilitate sputtering materials from the target 220. In one embodiment, the target 220 may be fabricated from a metal containing material, such as titanium (Ti), tantalum (Ta), magnesium (Mg), silver (Si), indium (In), tin (Sn), indium tin oxide (ITO), indium tin oxide (ITO), indium zinc oxide (IZO), indium tin zinc oxide (ITZO), aluminum (Al), tungsten (W), gold (Au), molybdenum (Mo), mercury (Hg), chromium (Cr), metal, metal alloy or other suitable materials. In another embodiment, the target 220 may be fabricated by materials including indium tin alloy and the like.

The target 220 generally includes a peripheral portion 224 and a central portion 216. The peripheral portion 224 is disposed over the sidewalls 210 of the chamber 200. The central portion 216 of the target 220 may have a curvature surface slightly extending towards the surface of the substrate 102 disposed on a substrate support 238. The spacing between the target 220 and the substrate support 238 is maintained between about 50 mm and about 150 mm. It is noted that the dimension, shape, materials, configuration and diameter of the target 220 may be varied for specific process or substrate requirements. In one embodiment, the target 220 may further include a backing plate having a central portion bonded and/or fabricated from a material desired to be sputtered onto the substrate surface. The target 220 may also include a plurality of tiles or segment materials that together form the target.

The lid assembly 204 may further comprise a magnetron assembly 202 mounted above the target 220 which enhances efficient sputtering of material from the target 220 during processing. Examples of the magnetron assembly include a linear magnetron, a serpentine magnetron, a spiral magnetron, a double-digitated magnetron, a rectangularized spiral magnetron, among others.

The ground shield assembly 226 of the lid assembly 204 includes a ground frame 206 and a ground shield 212. The ground shield assembly 226 may also include other chamber shield members, target shield member, dark space shield, and dark space shield frame. The ground shield 212 is coupled to the peripheral portion 224 by the ground frame 206 defining an upper processing region 254 below the central portion 216 of the target 220 in the process volume 218. The ground frame 206 electrically insulates the ground shield 212 from the target 220 while providing a ground path to the chamber body 208 of the process chamber 200 through the sidewalls 210. The ground shield 212 constrains plasma generated during processing within the upper processing region 254 so that dislodged target source material from the central portion 216 of the target 220 is mainly deposited on the substrate surface rather than chamber sidewalls 210. In one embodiment, the ground shield 212 may be formed by one or more components.

A shaft 240 that extends through the bottom 246 of the chamber body 208 couples the substrate support 238 to a lift mechanism 244. The lift mechanism 244 is configured to move the substrate support 238 between a lower transfer position and an upper processing position. A bellows 242 circumscribes the shaft 240 and is coupled to the substrate support 238 to provide a flexible seal therebetween, thereby maintaining vacuum integrity of the chamber processing volume 218.

A shadow frame 222 is disposed on the periphery region of the substrate support 238 and is configured to confine deposition of source material sputtered from the target 220 to a desired portion of the substrate surface. When the substrate support 238 is in a lowered position, the shadow frame 222 is suspended above the substrate support 238 from a lip 256 of a chamber shield 236 that extends from the sidewall 210 of the chamber body 208. As the substrate support 238 is raised to the upper position for processing, an outer edge of the substrate 102 disposed on the substrate support 238 contacts the shadow frame 222, causing the shadow frame 222 to be lifted and spaced away from the chamber shield 236. In or while moving into the lowered position, lift pins (not shown) are selectively moved through the substrate support 238 to lift the substrate 102 above the substrate support 238 to facilitate access to the substrate 102 by a transfer robot or other suitable transfer mechanism.

A controller 248 is coupled to the processing chamber 200 and, optionally, the processing chamber 100. The controller 248 includes a central processing unit (CPU) 260, a memory 258, and support circuits 262. The controller 248 is utilized to control the process sequence, regulating the gas flows from the gas source 228 into the chamber 200 and controlling ion bombardment of the target 220. The CPU 260 may be of any form of a general purpose computer processor that can be used in an industrial setting. The software routines can be stored in the memory 258, such as random access memory, read only memory, floppy or hard disk drive, or other form of digital storage. The support circuits 262 are conventionally coupled to the CPU 260 and may comprise cache, clock circuits, input/output subsystems, power supplies, and the like. The software routines, when executed by the CPU 260, transform the CPU into a specific purpose computer (controller) 248 that controls the processing chamber 200 such that the processes are performed in accordance with the present invention. The software routines may also be stored and/or executed by a second controller (not shown) that is located remotely from the chamber 200.

During processing, the target 220 and the substrate support 238 are biased relative to each other by the power source 232 to maintain a plasma formed from the process gases supplied by the gas source 228. The ions from the plasma are accelerated toward and strike the target 220, causing target material to be dislodged from the target 220. The dislodged target material forms a layer on the substrate 102. In embodiments where certain process gases are supplied into the chamber 200, the dislodged target material and the process gases present in the chamber 200 react to forms a composite film on the substrate 102.

Figure 7:
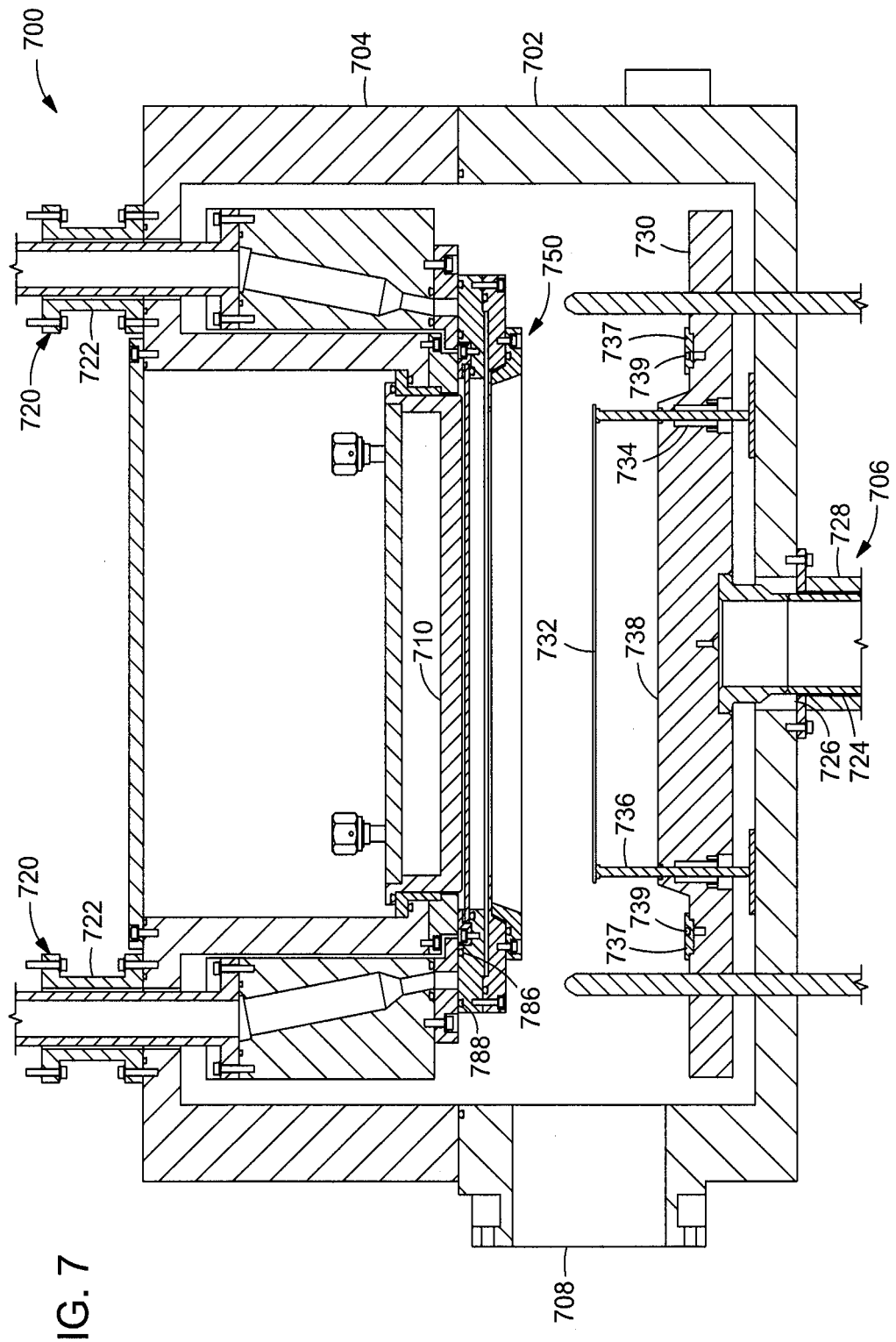
FIG. 7 depicts a sectional view of a processing chamber that may be used to deposit a high-k material in accordance with one embodiment of the present disclosure.

Referring first to FIG. 7, FIG. 7 is a schematic cross sectional view of an ALD (atomic layer deposition) chamber 700 that may be used to perform a deposition described herein. The ALD deposition process may be utilized to form a dielectric layer, such as an insulating layer, a gate insulating layer, an etch stop layer, an interlayer insulator, a dielectric layer for capacitor or passivation layer in a TFT device structure as described herein. The chamber 700 generally includes a chamber body 702, a lid assembly 704, a substrate support assembly 706, and a process kit 750. The lid assembly 704 is disposed on the chamber body 702, and the substrate support assembly 706 is at least partially disposed within the chamber body 702. The chamber body 702 includes a slit valve opening 708 formed in a sidewall thereof to provide access to the interior of the processing chamber 700. In some embodiments, the chamber body 702 includes one or more apertures that are in fluid communication with a vacuum system (e.g., a vacuum pump). The apertures provide an egress for gases within the chamber 700. The vacuum system is controlled by a process controller to maintain a pressure within the ALD chamber 700 suitable for ALD processes. The lid assembly 704 may include one or more differential pumps and purge assemblies 720. The differential pump and purge assemblies 720 are mounted to the lid assembly 704 with bellows 722. The bellows 722 allow the pump and purge assemblies 720 to move vertically with respect to the lid assembly 704 while still maintaining a seal against gas leaks. When the process kit 750 is raised into a processing position, a compliant first seal 786 and a compliant second seal 788 on the process kit 750 are brought into contact with the differential pump and purge assemblies 720. The differential pump and purge assemblies 720 are connected with a vacuum system (not shown) and maintained at a low pressure.

As shown in FIG. 7, the lid assembly 704 includes a RF cathode 710 that can generate a plasma of reactive species within the chamber 700 and/or within the process kit 750. The RF cathode 710 may be heated by electric heating elements (not shown), for example, and cooled by circulation of cooling fluids, for example. Any power source capable of activating the gases into reactive species and maintaining the plasma of reactive species may be used. For example, RF or microwave (MW) based power discharge techniques may be used. The activation may also be generated by a thermally based technique, a gas breakdown technique, a high intensity light source (e.g., UV energy), or exposure to an x-ray source.

The substrate support assembly 706 can be at least partially disposed within the chamber body 702. The substrate support assembly 706 can include a substrate support member or susceptor 730 to support a substrate 732 for processing within the chamber body. The susceptor 730 may be coupled to a substrate lift mechanism (not shown) through a shaft 724 or shafts 724 which extend through one or more openings 726 formed in a bottom surface of the chamber body 702. The substrate lift mechanism can be flexibly sealed to the chamber body 702 by a bellows 728 that prevents vacuum leakage from around the shafts 724. The substrate lift mechanism allows the susceptor 730 to be moved vertically within the ALD chamber 700 between a lower robot entry position, as shown, and processing, process kit transfer, and substrate transfer positions. In some embodiments, the substrate lift mechanism moves between fewer positions than those described.

In some embodiments, the substrate 732 may be secured to the susceptor using a vacuum chuck (not shown), an electrostatic chuck (not shown), or a mechanical clamp (not shown). The temperature of the susceptor 730 may be controlled (by, e.g., a process controller) during processing in the ALD chamber 700 to influence temperature of the substrate 732 and the process kit 750 to improve performance of the ALD processing. The susceptor 730 may be heated by, for example, electric heating elements (not shown) within the susceptor 730. The temperature of the susceptor 730 may be determined by pyrometers (not shown) in the chamber 700, for example.

As shown in FIG. 7, the susceptor 730 can include one or more bores 734 through the susceptor 730 to accommodate one or more lift pins 736. Each lift pin 736 is mounted so that they may slide freely within a bore 734. The support assembly 706 is movable such that the upper surface of the lift pins 736 can be located above the substrate support surface 738 of the susceptor 730 when the support assembly 706 is in a lower position. Conversely, the upper surface of the lift pins 736 is located below the upper surface 738 of the susceptor 730 when the support assembly 706 is in a raised position. When contacting the chamber body 702, the lift pins 736 push against a lower surface of the substrate 732, lifting the substrate off the susceptor 730. Conversely, the susceptor 730 may raise the substrate 732 off of the lift pins 736.

In some embodiments, the susceptor 730 includes process kit insulation buttons 737 that may include one or more compliant seals 739. The process kit insulation buttons 737 may be used to carry the process kit 750 on the susceptor 730. The one or more compliant seals 839 in the process kit insulation buttons 737 are compressed when the susceptor lifts the process kit 850 into the processing position.

Figure 3:
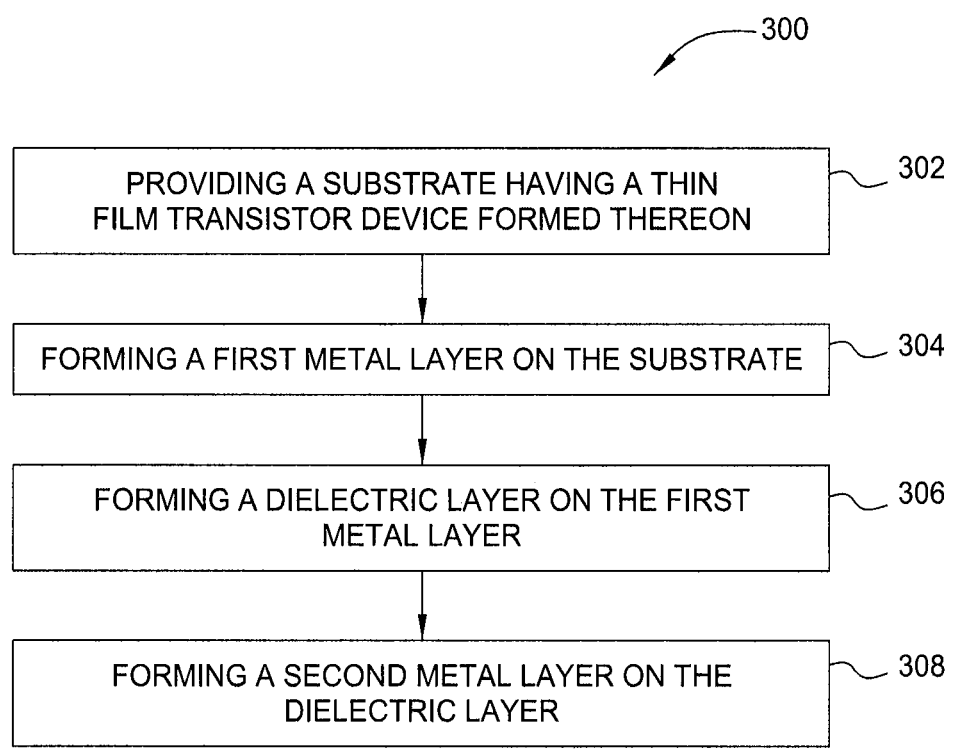
FIG. 3 depicts a process flow diagram of one embodiment of a method of forming a portion of a TFT device structure.

FIG. 3 depicts a flow diagram of one embodiment of a process 300 for forming a capacitor or an insulating layer suitable for use in thin-film transistor devices. Suitable examples of the insulating layer used in thin-film transistor devices include a gate insulating layer, an interface layer, a dielectric layer utilized to form a capacitor, an etch stop layer or a passivation layer where an insulating material is needed. In one example, the capacitor may include a dielectric layer or an insulating layer formed between a pixel electrode and a common electrode. The dielectric layer or the insulating layer may be formed by a plasma enhanced chemical vapor deposition (PECVD) process, which may be practiced in the processing chamber 100, as described in FIG. 1, or an atomic layer deposition (ALD) process, which may be practiced in the processing chamber 700, as described in FIG. 7, or other suitable processing chamber. The pixel electrode and the common electrode may be formed by a physical vapor deposition (PVD) process, which may be practiced in the processing chamber 200, as described in FIG. 2.

The process 300 begins at operation 302 by providing the substrate 102 in a processing chamber, such as the processing chamber 200 (a PVD chamber) depicted in FIG. 2. The substrate 102 may include a TFT device partly formed thereon readily to form a common electrode on the substrate 102. In the example depicted in FIG. 4, the substrate 102 may include a planar surface 419 of a planarization layer 418 that ready to have a common electrode 420 to be formed thereon. The common electrode 420 along with a dielectric layer 424 (or called an insulating layer) and a pixel electrode 426, as indicated by the circle 460, may together form a capacitor 427 in the TFT device structure 450, which will be later described in detail regarding variations of the structures of the capacitor 427 in FIGS. 5A-5C at different manufacturing stage of process 300. It is noted that the material utilized to form the dielectric layer 424 (or the insulating layer) may also be utilized to form as other layers that require insulating materials in the TFT device structure 450.

Figure 4:
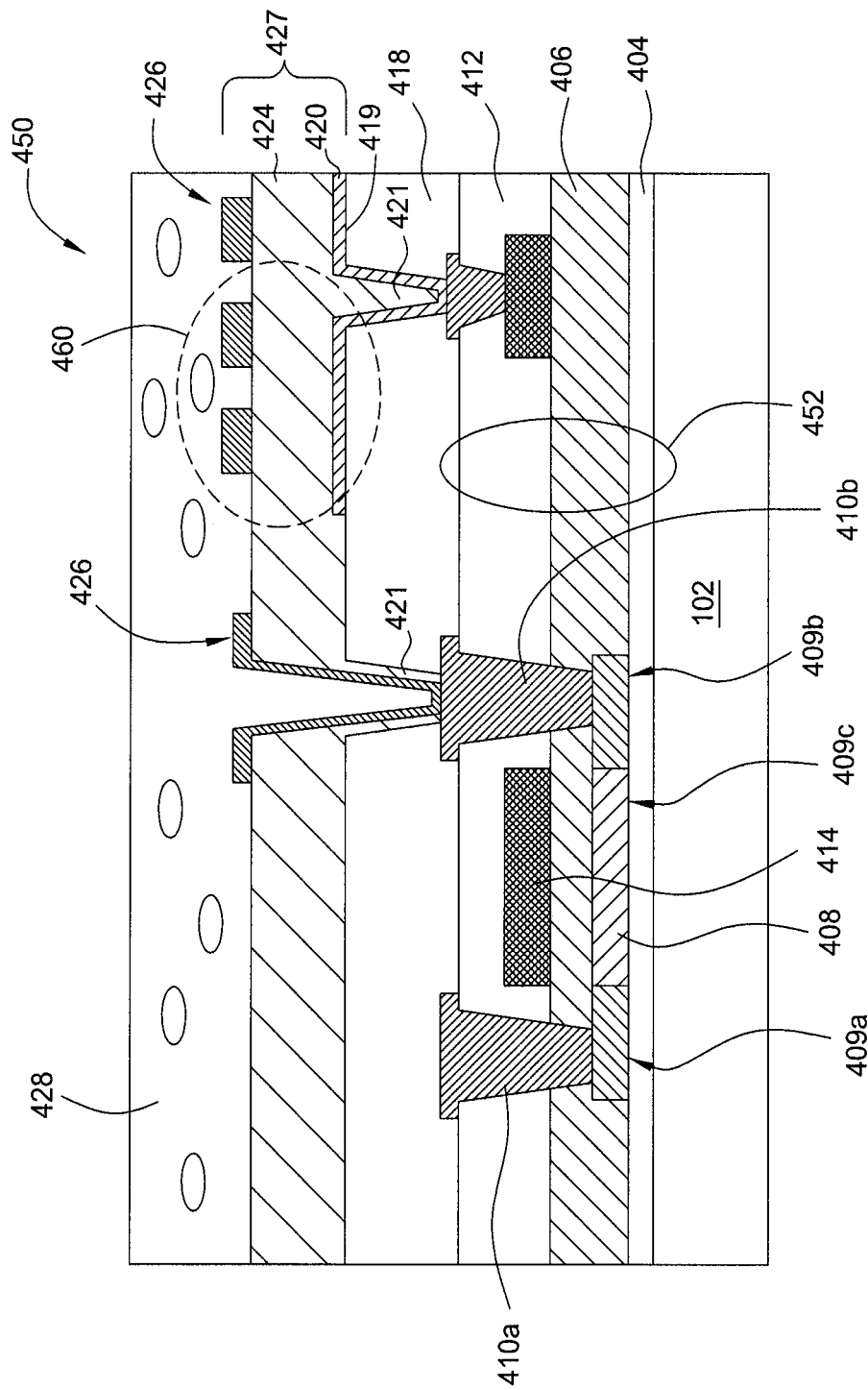
FIG. 4 is a sectional view of one example of a thin film transistor device structure.

In the example depicted in FIG. 4, the TFT device 450 formed on the substrate 102 comprises a low temperature polysilicon (LTPS) TFT device. The substrate 102 may have different combination of films, structures or layers previously formed thereon to facilitate forming different device structures or different film stack on the substrate 102. The substrate 102 may be any one of glass substrate, plastic substrate, polymer substrate, metal substrate, singled substrate, roll-to-roll substrate, or other suitable transparent substrate suitable for forming a thin film transistor thereon.

The LTPS TFT devices 450 are MOS devices built with a source region 409a, channel region 408, and drain region 409b formed on the optically transparent substrate 402 with or without an optional insulating layer 404 disposed thereon. The source region 409a, channel region 408, and drain region 409b are generally formed from an initially deposited amorphous silicon (a-Si) layer that is typically later thermal or laser processed to form a polysilicon layer. The source, drain and channel regions 409a, 408, 409b can be formed by patterning areas on the optically transparent substrate 402 and ion doping the deposited initial a-Si layer, which is then thermally or laser processed (e.g., an Excimer Laser Annealing process) to form the polysilicon layer. A gate insulating layer 406 is then deposited on top of the deposited polysilicon layer(s) to isolate a gate electrode 414 from the channel region 408, source region 409a and drain regions 409b. The gate electrode 414 is formed on top of the gate insulating layer 406. The gate insulating layer 406 is also commonly known as a gate oxide layer. An interlayer insulator 412 and device connections are then made through the insulating layer to allow control of the TFT devices.

After the interlayer insulator 412 is formed, a source-drain metal electrode layer 410a, 410b is then deposited, formed and patterned in the interlayer insulator 412 electrically connected to the source region 409a and drain regions 409b. After the source-drain metal electrode layer 410a, 410b is patterned, the planarization layer 418 is then formed over the source-drain metal electrode layer 410a, 410b to provide a planar surface 419 where a common electrode 420 may be later formed thereon and patterned. The planarization layer 418 may be fabricated from polyimide, benzocyclobutene-series resin, spin on glass (SOG) or acrylate. The planarization layer 418 is later patterned to form a via contact hole 421 that allows the common electrode 420 (e.g., a beginning step of process 300 to provide a metal material) along with a dielectric layer 424 and/or a pixel electrode 426 to be sequentially filled therein. It is noted that the structure shown in FIG. 4 is just an exemplary embodiment of the TFT device 450. The via contact hole 421 may be filled partly or fully by the common electrode 420, the dielectric layer 424 or the pixel electrode 426 in any configuration as needed. The pixel electrode 426 and the common electrode 420 along with the dielectric layer 424 formed therebetween, in combination, form the capacitor 427 (e.g., a MIM (metal-insulating-metal) structure) in the TFT device 450, as illustrated in the example depicted in FIG. 4. After the pixel electrode 426 is formed, other insulating layer 428, such as an organic layer or a liquid crystal layer, may be formed on the structure of the capacitor 427 to further complete the structure of the device 450.

It is noted that the process 300 of FIG. 3 describes the process sequence of forming the capacitor 427, including the common electrode 420, the dielectric layer 424 and the pixel electrode 426, on the substrate 102.

Figure 5A:
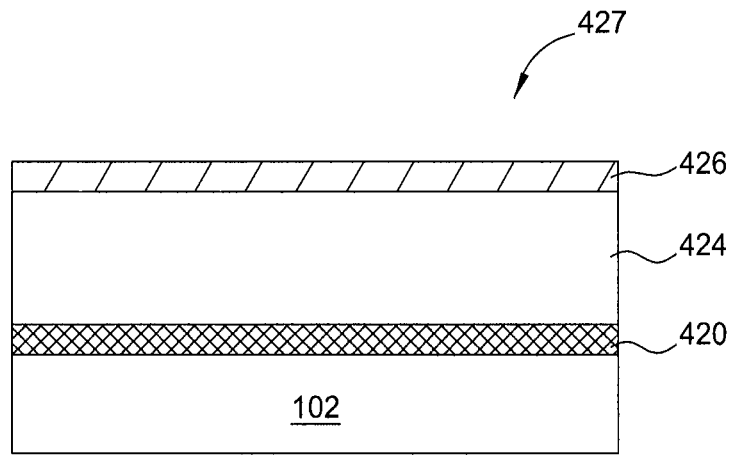
FIGS. 5A-5C depict different examples of film structures that may be utilized in the thin film transistor of FIG. 4.
Figure 5B:
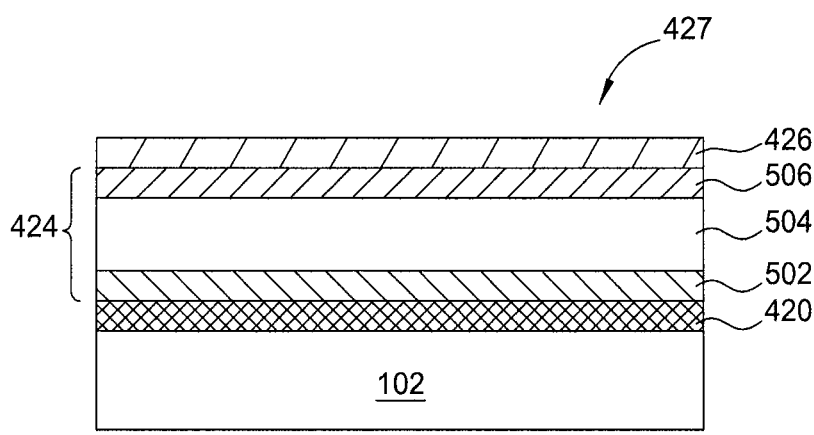
Figure 5C:
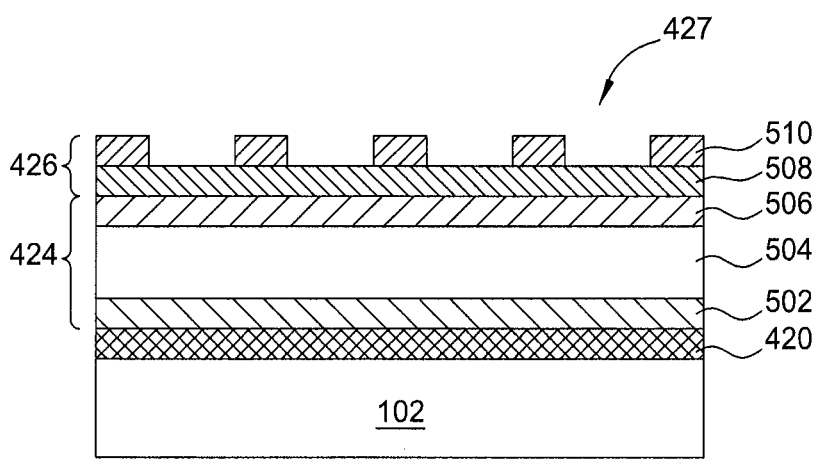

At operation 304, a physical vapor deposition process is performed to form the common electrode 420 (e.g., a first metal layer) on the substrate 102, as shown in FIG. 5A. It is noted that the common electrode 420, the dielectric layer 424 and the pixel electrode 426 shown in FIGS. 5A-5C are equivalent to the common electrode 420, the dielectric layer 424 and the pixel electrode 426 shown in FIG. 4.

In one example, the common electrode 420 formed on the substrate 102 is fabricated from a suitable metallic materials, such as indium tin oxide (ITO), indium zinc oxide (IZO), indium tin zinc oxide (ITZO), aluminum (Al), tungsten (W), chromium (Cr), tantalum (Ta), titanium (Ti), molybdenum (Mo), magnesium (Mg), silver (Ag), gold (Au), chromium (Cr), silver nano ink, carbon nano tube (CNT), silver nano ink, graphene, alloys thereof or combination thereof. In one particular example, the common electrode 420 is an indium tin zinc oxide (ITO) layer.

It is noted that the common electrode 420 may be patterned in any form or in any manner as needed prior to forming the dielectric layer 424 thereon as described at operation 306.

At operation 306, after the common electrode 420 is formed on the substrate 102 and optionally patterned as needed, the dielectric layer 424 is then formed on the substrate 102, as shown in FIG. 5A. The dielectric layer 424 may be formed on the substrate 102 by transferring the substrate 102 to a deposition chamber, such as the plasma enhanced chemical vapor deposition chamber 100 depicted in FIG. 1, to perform a chemical vapor deposition process on the substrate 102.

In one example, the dielectric layer 424 may be a single layer fabricated by a high-k material, e.g., a dielectric material having a dielectric constant greater than 8. Suitable examples of the high-k material layer include hafnium dioxide ($HfO_2$), hafnium oxynitride (HfON), zirconium dioxide ($ZrO_2$), zirconium oxynitride (ZrON), aluminum oxide ($Al_2O_3$), aluminum oxynitride (AlON), hafnium silicon oxide ($HfSiO_2$), hafnium aluminum oxide (HfAlO), zirconium silicon oxide ($ZrSiO_2$), tantalum dioxide ($Ta_2O_5$), aluminum oxide, $Y_2O_3$, $La_2O_3$, titanium oxide ($TiO_2$), aluminum doped hafnium dioxide, bismuth strontium titanium (BST), and platinum zirconium titanium (PZT), among others. It is noted that the dielectric layer 424 may be fabricated by a CVD process, a ALD process or any suitable deposition processes. In the example wherein the dielectric layer 424 is configured to be a high-k material, the high-k material of the dielectric layer 424 may be fabricated by a ALD process in a ALD chamber, such as the processing chamber 700 depicted in FIG. 7.

Utilizing the high-k material formed as the dielectric layer 424, a high dielectric constant may be formed in the structure of the capacitor 427 and, thus, a high capacitance may be obtained as capacitance of the capacitor increases as the dielectric constant of the dielectric layer formed in the capacitor increases. High capacitance provided by the dielectric layer 424 may improve the electrical performance of the TFT devices 450 while reducing the undesired current leakage and tunneling effect. Thus, utilizing a high-k material as the dielectric layer 424 in the capacitor 427, the capacitance of the capacitor 427 with high-k material dielectric layer 424 may be enhanced and improved as compared to using a conventional silicon nitride or silicon oxide layer as the dielectric layer in a capacitor.

In some examples, the dielectric layer 424 formed on the substrate 102 may be in form of composite structures having multiple layers, as shown in FIG. 5B. In one embodiment, the dielectric layer 424 may include a bulk dielectric material 504 sandwiched between a top interface protection layer 506 and a bottom interface protection layer 502. The top interface protection layer 506 may be in contact with the pixel electrode 426 later formed thereon while the bottom interface protection layer 502 may be formed in contact with the common electrode 420. In this particular example, the bulk dielectric material 504 may be fabricated by a silicon nitride material (SiN) or a high-k material while the top and the bottom interface protection layer 506, 502 may be silicon containing dielectric materials, such as silicon oxide ($SiO_2$), silicon oxynitride (SiON), silicon oxycarbide (SiOC), silicon carbide (SiC) and the like. In one example, the top and the bottom interface protection layer 506, 502 may be a silicon oxynitride (SiON) material when the bulk dielectric material 504 is a silicon nitride material (SiN). In another example, the top and the bottom interface protection layer 506, 502 may be a silicon oxide material ($SiO_2$) or silicon oxynitride (SiON) when the bulk dielectric material 504 is a high-k material, as the dielectric layer 424 as depicted in FIG. 5A.

In one example, the top and the bottom interface protection layers 506, 502 may be formed by a CVD deposition process. In another example, the top interface protection layer 506 may be formed by oxidizing, oxygen ion implantation or oxygen surface treatment on the bulk dielectric material 504 by an oxygen containing gas, such as $O_2$, $O_3$ or $H_2O$, when the bulk dielectric material 504 is a silicon nitride material (SiN) so as to oxidize the surface of the silicon nitride from the bulk dielectric material 504 into a silicon oxynitride layer.

It is believed that the top and the bottom interface protection layers 506, 502 formed between the pixel electrode 426 and the common electrode 420 may assist bridging the bulk dielectric material 504 to the top and/or the bottom interface protection layers 506, 502 so as to enhance the adhesion of the structure of the capacitor 427 without film peeling concerns. Furthermore, the top and the bottom interface protection layers 506, 502 may also serve as a thermal stable interface structure so as to reduce leakage from the metallic pixel and common electrodes 426, 420.

The top and/or the bottom interface protection layers 506, 502 may be formed in the same processing chamber where the bulk dielectric material 504 (a silicon nitride material or a high-k material) is formed. Alternatively, the top and/or the bottom interface protection layers 506, 502 may be formed in any suitable chambers as needed.

At operation 308, after the dielectric layer 424 is formed on the substrate 102, the pixel electrode 426 (e.g., a second metal layer) is then formed on the dielectric layer 424. Similar to the process for forming the common electrode 420 described at operation 304, the pixel electrode 426 may be fabricated from any suitable metallic materials, such as indium tin oxide (ITO), indium zinc oxide (IZO), indium tin zinc oxide (ITZO), aluminum (Al), tungsten (W), chromium (Cr), tantalum (Ta), titanium (Ti), molybdenum (Mo), magnesium (Mg), silver (Ag), gold (Au), chromium (Cr), silver nano ink, carbon nano tube (CNT), silver nano ink, graphene, alloys thereof or combination thereof. The pixel electrode 426 may also be formed by a physical vapor deposition process (PVD) performed in a plasma deposition chamber such as the process chamber 200 depicted in FIG. 2.

In one embodiment, the pixel electrode 426 may be in form of a single layer formed by a metallic material discussed above in this paragraph, as shown in FIGS. 5A-5B. Alternatively, the pixel electrode 426 may be in form of a composite structure having multiple materials, such as first metal electrode 508 with a second metal electrode 510 formed thereon, as shown in FIG. 5C.

In one example, the first electrode 508 and the second electrode 510 may be a metal material selected from indium tin oxide (ITO), indium zinc oxide (IZO), indium tin zinc oxide (ITZO), aluminum (Al), tungsten (W), chromium (Cr), tantalum (Ta), titanium (Ti), molybdenum (Mo), magnesium (Mg), silver (Ag), gold (Au), chromium (Cr), silver nano ink, carbon nano tube (CNT), silver nano ink, graphene or alloys thereof. In one particular example, the first electrode 508 is an ITO layer and the second electrode 510 may be a metal layer selected from Ta, Ti, Al, Mg, Mo, W, Ag, Mg or alloys thereof. In another example, in contrast, the first electrode 508 may be a metal layer of Ta, Ti, Al, Mg, Mo, W, Ag, Mg or alloys thereof and the second electrode 510 may be an ITO layer.

In a particular example, the second electrode 510 may be patterned to be in the form of a mesh or grid electrode formed on the first electrode 508. In another example, the pixel electrode 426 and/or the common electrode 420 may be also be in form of a mesh or grid electrode as needed.

Similarly, the high-k material, e.g., a dielectric material having a dielectric constant greater than 8, may also be utilized to form as an insulating material in other locations or places of the TFT devices 450. For example, the high-k material may also be utilized to form the optional insulating layer 404, the gate insulating layer 406 or the interlayer insulator 412, as indicated by the circle 452 in FIG. 4. As described above, suitable examples of the high-k material layer include hafnium dioxide ($HfO_2$), hafnium oxynitride (HfON), zirconium dioxide ($ZrO_2$), zirconium oxynitride (ZrON), aluminum oxide ($Al_2O_3$), aluminum oxynitride (AlON), hafnium silicon oxide ($HfSiO_2$), hafnium aluminum oxide (HfAlO), zirconium silicon oxide ($ZrSiO_2$), tantalum dioxide ($Ta_2O_5$), aluminum oxide, $Y_2O_3$, $La_2O_3$, titanium oxide ($TiO_2$), aluminum doped hafnium dioxide, bismuth strontium titanium (BST), and platinum zirconium titanium (PZT), among others.

Figure 6A:
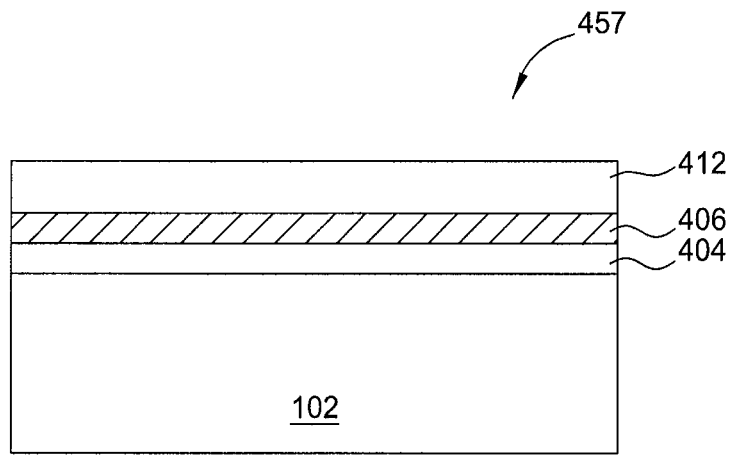
FIGS. 6A-6C depict different examples of film structures that may be utilized in the thin film transistor of FIG. 4.
Figure 6B:
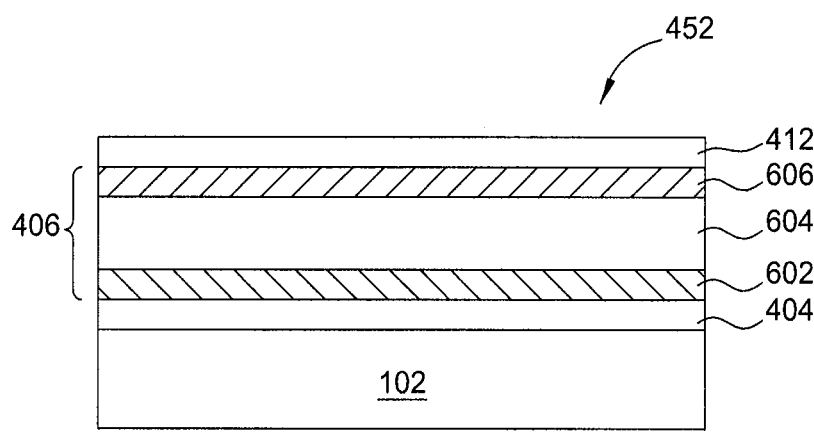
Figure 6C:
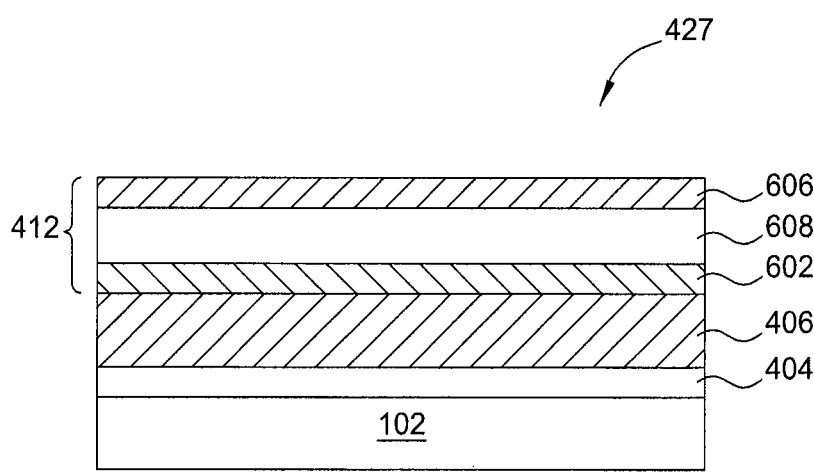

FIGS. 6A-6C depict different film stack arrangements or configurations of the optional insulating layer 404, the gate insulating layer 406 and the interlayer insulator 412, as indicated by the circle 452 in FIG. 4. As described above, any one (or all) of the optional insulating layer 404, the gate insulating layer 406 and the interlayer insulator 412 may be the high-k material, e.g., a dielectric material having a dielectric constant greater than 8, as needed, as shown in FIG. 6A. The high-k material of the optional insulating layer 404, the gate insulating layer 406 or the interlayer insulator 412 may be formed by an ALD process performed in an ALD chamber, such as the processing chamber 700 depicted in FIG. 7, a CVD process performed in a PECVD, such as the processing chamber 100 depicted in FIG. 1, or a CVD-ALD hybrid process performed both in a CVD and a ALD processing chamber in any order and any time during the manufacturing process as needed.

Alternatively, the gate insulating layer 406 may also be in form of a composite structure with more than one layer formed therein. In the example depicted in FIG. 6B, the gate insulating layer 406 is similar to the dielectric layer 424 depicted in FIGS. 5B and 5C with in total three layers 602, 604, 606 formed therein. More specifically, as described above, the gate insulating layer 406 may include the bulk gate insulating layer 604 sandwiched between the top interface protection layer 606 and the bottom interface protection layer 602. The top interface protection layer 606 may be in contact with the interlayer insulator 412 later formed thereon while the bottom interface protection layer 602 may be formed in contact with the optional insulating layer 404. In this particular example, the bulk gate insulating layer 604 may be fabricated by a high-k material while the top and the bottom interface protection layer 606, 602 may be silicon containing dielectric materials, such as silicon nitride silicon oxide ($SiO_2$), silicon oxynitride (SiON), silicon oxycarbide (SiOC), silicon carbide (SiC) and the like. In one example, the top and the bottom interface protection layer 606, 602 may be a silicon oxynitride (SiON) or silicon nitride (SiN) material when the bulk gate insulating layer 606 is a high-k material, as the dielectric layer 424 as depicted in FIG. 5B or 5C.

Alternatively, in another example depicted in FIG. 6C, the interlayer insulator 412 may also be constructed as more than one layer formed therein. In the example depicted in FIG. 6C, the interlayer insulator 412 is similar to the gate insulating layer 406 depicted in FIG. 6C with in total three layers 602, 608, 606 formed therein. More specifically, as described above, the gate interlayer insulator 412 may include the bulk interlayer insulator 608 sandwiched between the top interface protection layer 606 and the bottom interface protection layer 602. The top interface protection layer 606 may be in contact with the planarization layer 418 (as shown in FIG. 4) later formed thereon while the bottom interface protection layer 602 may be formed in contact with the gate insulating layer 406. In this particular example, the bulk interlayer insulator 608 may be fabricated by a high-k material while the top and the bottom interface protection layer 606, 602 may be silicon containing dielectric materials, such as silicon nitride silicon oxide ($SiO_2$), silicon oxynitride (SiON), silicon oxycarbide (SiOC), silicon carbide (SiC) and the like. In one example, the top and the bottom interface protection layer 606, 602 may be a silicon oxynitride (SiON) or silicon nitride (SiN) material when the bulk interlayer insulator 608 is a high-k material, as the dielectric layer 424 as depicted in FIG. 5B or 5C or the gate insulating layer 406 depicted in FIG. 6B.

Thus, the methods described herein advantageously improve the electron stability, electrical performance, high capacitance, low leakage and good film stack integration of TFT device structures by controlling the materials and structures of a gate insulating layer, insulating materials in the devices, a pixel electrode, a common electrode along with a dielectric layer formed therebetween as a high electrical performance capacitor in the TFT device structures.

While the foregoing is directed to embodiments of the present disclosure, other and further embodiments of the disclosure may be devised without departing from the basic scope thereof, and the scope thereof is determined by the claims that follow.

What is claimed is:

1. A thin film transistor structure comprising:
   a capacitor formed in a thin film transistor device, the capacitor further comprising:
   a gate electrode disposed overlying a substrate;
   a common electrode disposed overlying the gate electrode;
   a dielectric layer formed on the common electrode, wherein the dielectric layer includes a bulk dielectric material sandwiched between a top interface protection layer and a bottom interface protection layer; and
   a pixel electrode formed on the dielectric layer, the top interface protection layer formed in contact with the pixel electrode and the bottom interface protection layer formed in contact with the common electrode.

2. The structure of claim 1, wherein the dielectric layer is a high-k material having a dielectric constant greater than 8.

3. The structure of claim 2, wherein the top interface protection layer is a silicon oxide or silicon oxynitride layer.

4. The structure of claim 1, wherein the top interface protection layer is a silicon containing material.

5. The structure of claim 1, wherein the top interface protection layer is a silicon oxynitride layer when the dielectric layer is a silicon nitride layer.

6. The structure of claim 1, wherein the common electrode and the pixel electrode are fabricated from a material selected from a group consisting of indium tin oxide (ITO), indium zinc oxide (IZO), indium tin zinc oxide (ITZO), aluminum (Al), tungsten (W), chromium (Cr), tantalum (Ta), titanium (Ti), molybdenum (Mo), magnesium (Mg), silver (Ag), gold (Au), chromium (Cr), silver nano ink, carbon nano tube (CNT), silver nano ink, graphene or alloys thereof.

7. The structure of claim 1, wherein the common electrode or the pixel electrode is a mesh or grid electrode.

8. The structure of claim 1, wherein the pixel electrode includes a first electrode and a second electrode disposed on the first electrode.

9. The structure of claim 8, wherein second electrode is a mesh or grid electrode.

10. A method for forming a capacitor structure on a substrate for thin film transistor applications comprising:
    forming a gate electrode disposed overlying a substrate;
    forming a common electrode disposed overlying the gate electrode;
    forming a dielectric layer on the common electrode, wherein the dielectric layer includes a bulk dielectric material sandwiched between a top interface protection layer and a bottom interface protection layer; and
    forming a pixel electrode on the dielectric layer, wherein the top interface protection layer is formed in contact with the pixel electrode and the bottom interface protection layer is formed in contact with the common electrode.

11. The method of claim 10, wherein the top interface protection layer is a silicon oxynitride layer or silicon oxide layer.

12. The method of claim 10, wherein the top interface protection layer is a silicon oxynitride layer when the dielectric layer is a silicon nitride layer.

13. The method of claim 10, wherein the top interface protection layer is a silicon oxide or silicon oxynitride layer when the dielectric layer is a high-k material having a dielectric constant greater than 8.

14. The method of claim 10, wherein the pixel electrode is a mesh or grid electrode.

15. The method of claim 10, wherein the common electrode and the pixel electrode are fabricated from a material selected from a group consisting of indium tin oxide (ITO), indium zinc oxide (IZO), indium tin zinc oxide (ITZO), aluminum (Al), tungsten (W), chromium (Cr), tantalum (Ta), titanium (Ti), molybdenum (Mo), magnesium (Mg), silver (Ag), gold (Au), chromium (Cr), silver nano ink, carbon nano tube (CNT), silver nano ink, graphene or alloys thereof.

16. The method of claim 10, wherein the pixel electrode includes a first electrode and a second electrode disposed on the first electrode.

17. The method of claim 16, wherein the second electrode is a mesh or grid electrode.

18. A method for forming an insulating layer on a substrate for thin film transistor applications comprising:
    forming a gate electrode disposed overlying the substrate;
    forming a common electrode disposed overlying the gate electrode;
    forming a high-k layer on the common electrode by an atomic layer deposition process or a hybrid process including atomic layer deposition and chemical vapor deposition process, wherein the high-k layer includes a bulk dielectric material sandwiched between a top interface protection layer and a bottom interface protection layer, wherein the high-k layer is one of a gate insulating layer, a passivation layer, a capacitor, an interlayer insulator, an etch stop layer in a thin film transistor device; and
    forming a pixel electrode on the high-k layer, wherein the top interface protection layer is formed in contact with the pixel electrode and the bottom interface protection layer is formed in contact with the common electrode.

19. The method of claim 18, wherein the thin film transistor device is a low temperature polysilicon (LTPS) TFT device.

* * * * *